United States Patent
Mehringer et al.

(10) Patent No.: US 9,985,625 B2
(45) Date of Patent: May 29, 2018

(54) METHOD FOR CONTROLLING AN ACTIVE BRIDGE RECTIFIER DURING LOAD SHEDDING, RECTIFIER SYSTEM, AND COMPUTER PROGRAM PRODUCT

(71) Applicant: SEG AUTOMOTIVE GERMANY GMBH, Stuttgart (DE)

(72) Inventors: Paul Mehringer, Stuttgart (DE); Christopher Otte, Reutlingen (DE)

(73) Assignee: SEG Automotive Germany GmbH, Stuttgart (DE)

( * ) Notice: Subject to any disclaimer, the term of this patent is extended or adjusted under 35 U.S.C. 154(b) by 286 days.

(21) Appl. No.: 14/425,497

(22) PCT Filed: Jul. 31, 2013

(86) PCT No.: PCT/EP2013/066079
§ 371 (c)(1),
(2) Date: Mar. 3, 2015

(87) PCT Pub. No.: WO2014/032894
PCT Pub. Date: Mar. 6, 2014

(65) Prior Publication Data
US 2015/0229230 A1    Aug. 13, 2015

(30) Foreign Application Priority Data
Sep. 3, 2012   (DE) .................. 10 2012 215 561

(51) Int. Cl.
*H02H 7/06* (2006.01)
*H03K 17/16* (2006.01)
(Continued)

(52) U.S. Cl.
CPC .......... *H03K 17/163* (2013.01); *H02H 7/067* (2013.01); *H02J 7/1461* (2013.01); *H02M 7/219* (2013.01);
(Continued)

(58) Field of Classification Search
CPC ...... H02M 3/156; H02M 3/158; H02H 7/067; H02H 7/10; H02H 7/1252
See application file for complete search history.

(56) References Cited

U.S. PATENT DOCUMENTS 5,252,860 A * 10/1993 McCarty .................. F02C 9/28
290/40 R
2003/0113600 A1 * 6/2003 Wardrop ........... H01M 8/04559
429/432

(Continued)

FOREIGN PATENT DOCUMENTS

DE         203 09 792       12/2003
DE      10 2009 046955       5/2011
(Continued)

*Primary Examiner* — Fred E Finch, III
*Assistant Examiner* — Rafael O De Leon Domenech
(74) *Attorney, Agent, or Firm* — Norton Rose Fulbright US LLP; Gerard A. Messina

(57) ABSTRACT

A method for controlling a bridge rectifier which includes active switching elements is provided, in which, during normal operation, at least one of the active switching elements is controlled using a voltage signal, the voltage of which is changed from a first voltage value to a second voltage value within at least one switching time. The at least one switching time is extended by a predefinable time period if load shedding at the bridge rectifier is determined. Also described is a corresponding rectifier system and a computer program product.

16 Claims, 5 Drawing Sheets

(51) Int. Cl.
*H02M 7/219* (2006.01)
*H02J 7/14* (2006.01)
*H02H 7/10* (2006.01)
*H02M 3/156* (2006.01)
*H02H 7/125* (2006.01)
*H02M 3/158* (2006.01)
*H02M 1/32* (2007.01)

(52) U.S. Cl.
CPC ............. *H02H 7/10* (2013.01); *H02H 7/1252* (2013.01); *H02M 1/32* (2013.01); *H02M 3/156* (2013.01); *H02M 3/158* (2013.01)

(56) References Cited

U.S. PATENT DOCUMENTS

| | | | |
|---|---|---|---|
| 2004/0150376 A1* | 8/2004 | Peter | H02H 7/067 322/29 |
| 2007/0170900 A1* | 7/2007 | Lee | H02M 7/062 323/260 |
| 2007/0236194 A1 | 10/2007 | Vo | |
| 2007/0279106 A1 | 12/2007 | Bennett et al. | |
| 2012/0081083 A1 | 4/2012 | Horihata et al. | |

FOREIGN PATENT DOCUMENTS

| | | |
|---|---|---|
| EP | 1 443 623 | 8/2004 |
| JP | H09-219938 A | 8/1997 |
| JP | 2007-166734 A | 6/2007 |
| JP | 2010-119217 A | 5/2010 |

* cited by examiner

METHOD FOR CONTROLLING AN ACTIVE BRIDGE RECTIFIER DURING LOAD SHEDDING, RECTIFIER SYSTEM, AND COMPUTER PROGRAM PRODUCT

FIELD OF THE INVENTION

The present invention relates to a method for controlling a bridge rectifier, which includes active switching elements, during load shedding, a rectifier system which is configured for carrying out a method of this type, and a computer program product.

BACKGROUND INFORMATION

Rectifiers of various designs may be used for feeding direct current systems out of three-phase current systems. The present patent application relates to active, i.e., controlled, bridge rectifiers which have active switching elements, for example in the form of known metal oxide semiconductor field effect transistors (MOSFETs). Bridge rectifiers having a six-pulse design are frequently used in vehicle electrical systems, corresponding to the three-phase current generators which are usually installed there. However, the present invention is similarly suitable for bridge rectifiers having other numbers of phases, for example five-phase generators, and in other use scenarios.

As explained in DE 10 2009 046 955 A1, for example, the use of active bridge rectifiers in motor vehicles is desirable, among other reasons, due to the fact that they have lower power losses compared to passive, i.e., uncontrolled, bridge rectifiers.

However, load shedding is a critical fault in particular in active bridge rectifiers. Load shedding (dumping) occurs when, for a highly excited generator and a correspondingly high delivered current, the load on the generator suddenly decreases, for example, by disconnecting consumers, and this is not intercepted by capacitively acting elements in the direct voltage network (for example, the battery in the vehicle electrical system).

In this regard, in the extreme case the generator may continue to deliver additional energy to the vehicle electrical system for a duration of up to approximately 300 ms to 500 ms. This energy must be converted (cleared) in the bridge rectifier in order to protect downstream electrical components from damage from overvoltage. In passive or uncontrolled bridge rectifiers, this protection is generally provided by the rectifier diodes themselves, since the lost energy may be converted into heat in the rectifier diodes. In presently available active switching elements such as MOSFETs, however, it is not possible to completely simulate these properties. Therefore, additional protective strategies are necessary.

During load shedding, some or all switching elements of the upper or lower rectifier branch may be completely or intermittently short-circuited, as also discussed in cited DE 10 2009 046 955 A1. An appropriate control signal may also be clocked in such a way that the voltage does not fall below a minimum voltage level and does not exceed a maximum voltage level.

However, multiple clocking of the control signal within a half-wave has disadvantages, since this requires an evaluation circuit for each phase, and an appropriate DC link capacitance must be provided for maintaining the vehicle electrical system voltage. This is difficult to achieve due to the thermal constraints and the required vibration resistance at the mounting location on the generator. In particular, however, when corresponding phase short circuits are deactivated, rapid current changes may also occur, which, in combination with the line inductances which are present, result in voltage peaks. As a result, connected components may be damaged.

Therefore, there continues to be a need for improved protective strategies for active bridge rectifiers during load shedding.

SUMMARY OF THE INVENTION

Against this background, the present invention provides a method for controlling a bridge rectifier, which includes active switching elements, during load shedding, a rectifier system which is configured for carrying out a method of this type, and a computer program product having the features of the independent patent claims.

One important aspect of the present invention is that, for controlling at least one active switching element of a bridge rectifier during load shedding, as the control signal a voltage signal is used which has an extended switching time at least compared to normal operation. Within the scope of the present patent application, "switching time" is understood to mean a time which elapses until a control signal, starting from a first, lower voltage value, has increased to a second, higher voltage value, or has decreased from the second, higher voltage value to the first, lower voltage value, i.e., has correspondingly changed (in one of the two directions). Thus, within the scope of the present invention, the slope of the control signal is changed.

During load shedding, the at least one active switching element is used to feed (i.e., as explained, to "short-circuit") an applied voltage signal, at least temporarily, to ground. In such phases, an active switching element which is used is controlled, i.e., acted on by a control signal whose voltage value is sufficient to establish a connection between the switchable terminals of the active switching element, for example to ground, via the at least one active switching element. Such a control signal is, for example, a voltage signal which is applied to a gate of an active switching element of the bridge rectifier, a MOSFET, for example. The switchable terminals of the active switching element are, for example, the drain and source terminals of the active switching element.

However, in addition to transistors, other active switching elements are suitable for use within the scope of the present invention, provided that different resistance values may be generated between corresponding switching terminals which are switchable by the active switching element, by a control with different voltage values between the first and the second voltage value. For example, at least one active switching element may be used in which a control which includes a gradual adjustment of the voltage values between the first and the second voltage value correlates with a gradual change in the forward resistance between the switching terminals (for example, linearly or in the form of a mathematical or empirically ascertainable function).

As is generally known, the forward resistance between the drain and the source in transistors, such as the mentioned MOSFETs, for example, depends on the voltage which is present between the gate and the source. Below a so-called threshold voltage, the connection between the drain and the source across the transistor is high-impedance, and above this threshold voltage is low-impedance.

However, when the threshold voltage is reached, the forward resistance does not drop abruptly to its minimum value, in which it is "shot through," as referred to in common usage.

This is also explained below in conjunction with FIG. 4. Instead, although the resistance initially dips sharply when the voltage between the gate and the source increases via the threshold voltage, it decreases only to a certain value above its minimum value. The minimum forward resistance does not occur until the voltage applied to the gate is once again increased, for example by 1 V to 2 V.

The mentioned first, lower voltage value of the control signal for controlling the at least one active switching element of the active bridge rectifier during load shedding is therefore just below (0.1 V, for example) the threshold voltage, and the second, higher voltage value is above the threshold voltage, in particular at a value for which the forward resistance is close to its minimum value. The second, higher voltage value may be, for example, 0.1 V to 2 V above the forward resistance.

In other words, it is provided to use a control signal in which passage through a specific voltage range between a first, lower voltage (the threshold voltage, for example) and a second, higher voltage (for example, the voltage with which the transistor is fed) in both directions is not more rapid than in a specific, predefined time period. The first, lower voltage and the second, higher voltage may be established, for example, based on manufacturer specifications and/or by measurements. For example, the first, lower voltage is given as the threshold voltage by the manufacturer, and the second, higher voltage is given as "RDS_on" or in the form of a comparable value.

This control is thus based on the consideration that the forward resistance between the drain and the source changes only slowly during a correspondingly slower voltage change in the mentioned range. This is advantageous in particular during the transition from the second, higher voltage to the first, lower voltage. In such a control, a current flow through the particular switching element, and thus a short circuit, is ultimately interrupted, and instead, a current is fed into the direct voltage network which is connected to the rectifier. The short circuit is appropriately activated during a transition from the first, lower voltage to the second, higher voltage.

During load shedding, if the passage through the mentioned range is in each case slower, the forward resistance is now changed gradually, instead of abruptly as before. During the time in which the forward resistance is changing, for example the current which is stored in the line inductances may decrease without marked overvoltages (during deactivation of the short circuit) or undervoltages (during activation of the short circuit) occurring. Such overvoltages or undervoltages are reliably avoided in this way.

By its nature, the control pattern according to the present invention is particularly advantageous during the mentioned transition from the second, higher voltage to the first, lower voltage, i.e., during deactivation of the short circuit. In conventional control, the inductances which are present frequently are initially not able to accept the current which is fed via the switching elements in this case, so that the voltage increases. Advantages also result from use of the method according to the present invention during the transition from the first, lower voltage to the second, higher voltage (i.e., during activation of the short circuit). In this case, undervoltages are avoided. Voltage peaks or dips as a whole are thus largely avoided by the method according to the present invention, and it is no longer possible for electronics systems such as controllers, which, for example, are mounted directly on the rectifier, to be damaged.

The mentioned specific time period may be ascertained, for example, based on the equation $U_L = L \times di/dt$. $U_L$ refers to the induced voltage at the feed line inductance which is present, and thus reflects the allowed replacement voltage between the nominal voltage or setpoint voltage of the direct voltage network and the voltage at the direct voltage output of the bridge rectifier (B+). For a maximum allowed induced voltage $U_L$ of 6 V, for example, and a given feed line inductance of 1.5 pH, the current rise cannot be more than 4 A/μs.

In addition, it is advantageous to ensure that an interruption of a phase short circuit at multiple switching elements does not take place at the same time. For this purpose, suitable time periods are set as a buffer. The individual phase currents are thus enabled in a staggered manner, which additionally limits the induced voltage rise in the feed line. For such staggering, it may sometimes even be sufficient for the start of the individual controls, using the switching time which is extended according to the present invention, for example due to tolerances in detection thresholds, to take place at staggered points in time. In other cases, known timing elements, for example, may be used for this purpose.

As explained in detail below, for the retarded control according to the present invention, for example for generating an appropriate voltage ramp for switching the switching element on and off, in the simplest case an RC element may be used. Other concepts for generating a longer switching time are also conceivable.

The present invention offers numerous advantages over conventional methods. For example, during load shedding it has been proposed to bring active switching elements, such as MOSFETs, into a linear operating condition via external wiring, and thus produce a system behavior which corresponds to the known Zener diodes. However, in this operating condition a high electrical power loss must be converted in the power electronics components. In contrast, according to the present invention, only comparatively low electrical power losses occur. The switching elements may therefore have a less robust configuration, which saves on costs.

The present invention also offers advantages over the methods, explained at the outset, in which, for clearing the energy which is released during load shedding, it is provided to completely or intermittently short-circuit some or all switching elements. In particular, a closely linked DC link capacitance, conventionally required for maintaining the vehicle electrical system voltage, is not necessary according to the present invention. As mentioned at the outset, due to the thermal constraints and the required vibration resistance, an appropriate DC link capacitance may be applied to the mounting location on the generator, at best, with a significant level of effort.

In particular, however, rapid current changes, and thus voltage peaks, which occur during the activation of phase short circuits are thus greatly reduced or completely avoided due to the measures provided according to the present invention. Therefore, it is not necessary to equip downstream components with a similarly complicated overvoltage protection.

An arithmetic unit according to the present invention, such as a control unit of a motor vehicle or a rectifier controller, is configured, in particular by programming, to carry out a method according to the present invention.

In addition, the implementation of the method in the form of software is advantageous, since this entails particularly low costs, in particular when an executing control unit may also be used for other tasks, and therefore is present anyway. Suitable data carriers for providing the computer program are in particular diskettes, hard drives, flash memories, EEPROMs, CD-ROMs, DVDs, and others. In addition, downloading a program via computer networks (Internet, intranet, etc.) is possible.

Further advantages and embodiments of the present invention result from the description and the appended drawing.

It is understood that the features mentioned above and to be explained below may be used not only in the particular stated combination, but also in other combinations or alone without departing from the scope of the present invention.

The present invention is schematically illustrated in the drawing based on one exemplary embodiment, and described in greater detail below with reference to the drawings.

Identical or mutually corresponding elements are denoted by the same reference numerals in the figures, and a repeated description of these elements is dispensed with.

DETAILED DESCRIPTION

Figure 1:
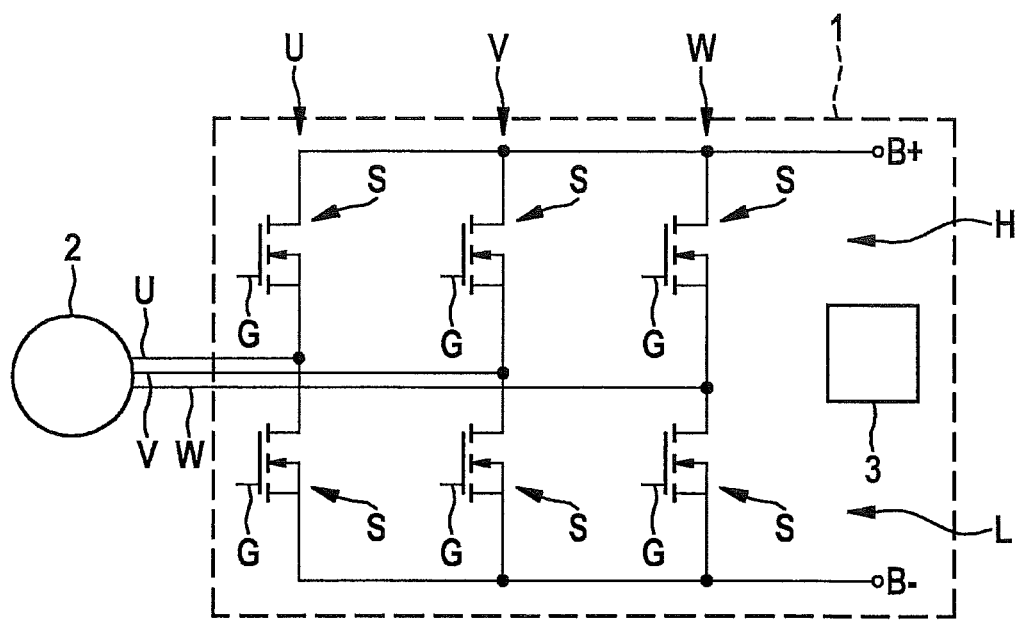
FIG. 1 shows a system having an active bridge rectifier which may be controlled according to the present invention, in a schematic illustration.

FIG. 1 schematically illustrates a system which includes a bridge rectifier 1 and a generator 2, using the example of a three-phase system. Bridge rectifier 1 may be controlled according to one specific embodiment of the present invention. The bridge rectifier is illustrated in FIG. 1 as a six-pulse bridge rectifier which is configured for rectifying a three-phase current of a three-phase generator 2. However, a four-, five-, six-, or seven-phase generator 2 and a correspondingly adapted bridge rectifier 1 may similarly also be used.

Bridge rectifier 1 has three half bridges U, V, and W which are connected to corresponding outputs of generator 2, and thus to the respective generator windings, via inputs u, v, and w, respectively.

Half bridges U, V, and W are connected on the output side to, for example, a positive battery terminal B+ and a negative battery terminal B− and/or corresponding supply lines B+ and B− of a direct voltage network. Terminal B− may be connected to ground. Half bridges U, V, and W in each case include active switching elements S, such as MOSFETs, which are integrated into an upper branch H and a lower branch L of the particular half bridges U, V, and W.

An input u, v, and w may be connected to B+ and/or B− according to appropriate wiring of active switching elements S, whereby simultaneous control in each case of both switching elements of a half bridge U, V, and W is to be avoided in order to prevent "hot paths" between B+ and B−.

Active switching elements S may be acted on via their respective gate terminals G by a control signal, provided by a control device 3 via control lines, not illustrated, corresponding to a control pattern. The normal operation of the generator includes controlling of active switching elements S in such a way that a current signal which is present at a corresponding input u, v, and w of a generator winding of generator 2 which is thus connected thereto is alternatingly fed to B+ and B−. This normally takes place in such a way that when a positive half-wave is present at inputs u, v, and w, the particular signal is fed to B+, whereas when a negative half-wave is present, the signal is fed to B−. An output voltage at B+ may also be set by appropriate clocking.

In a system illustrated in FIG. 1, load shedding may be detected based on a voltage which is present at B+. Load shedding may be recognized when a defined threshold value is exceeded.

When load shedding is recognized, rectifier 1 may be controlled in such a way that at least one of the phase windings of generator 2, which in each case is connected to the half bridges of rectifier 1 via one of inputs u, v, and w, is connected to B−, i.e., to ground, in a temporally defined manner. This is also referred to as "short-circuiting." As a result, the voltage drops. The voltage once again rises when the connection to ground is once again interrupted (i.e., the short circuit is deactivated). This sequence may be used for regulating the output voltage and/or for reducing an overvoltage of the generator. However, as mentioned, problems may arise as the result of current or voltage peaks due to the fact that a corresponding current is abruptly built up or reduced. The voltage peaks produce high power losses in the half bridges which may result in thermal destruction. Appropriate control with high-frequency clocking of a corresponding control signal is complicated, and may result in problems with regard to electromagnetic compatibility.

In addition, specific inputs u, v, and w, for example exactly one input u, v, and w, of rectifier 1 may be connected to B− during the time period when one complete positive half-wave from a phase winding connected to this input is applied, and simultaneously or alternatively, in each case exactly one input u, v, and w of rectifier 1 may be connected to B+ during the time period when one complete negative half-wave from a phase winding connected to this input is applied. Here as well, however, the problem of possibly occurring current or voltage peaks arises.

Figure 2:
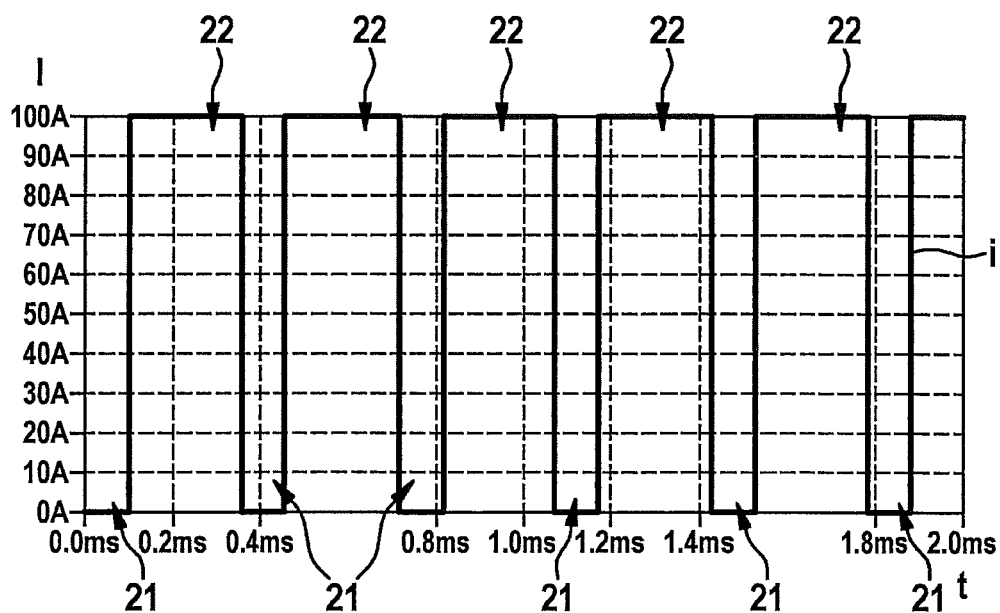
FIG. 2 shows a current pattern for control of an active bridge rectifier during load shedding, according to the related art.

FIG. 2 illustrates a generator current pattern in this type of control of an active bridge rectifier 1 during load shedding, according to the related art. In the diagram illustrated in FIG. 2, generator current pattern i as current I in A is plotted on the y axis as a function of time t in ms, plotted on the x axis.

As previously explained in conjunction with FIG. 1, within the scope of conventional control during load shedding, switching elements S are short-circuited to B−, for example, during certain time periods 21. In contrast, during time periods 22, a current is delivered to the direct voltage network. As is apparent, the current suddenly increases from 0 A to 100 A, for example, and correspondingly suddenly decreases. As explained, voltage peaks with corresponding negative effects may thus arise in conjunction with line inductances in the vehicle electrical system. This may be avoided according to the present invention, since the current pattern has flatter signal edges due to the correspondingly extended switching time. In other words, this allows a "soft" takeover of the current from the line inductances into the switching elements, or vice versa. The improvements which are achievable corresponding one specific embodiment of the present invention are apparent from FIGS. 5 and 6 explained below, in particular from subdiagrams A in these figures.

Figure 3:
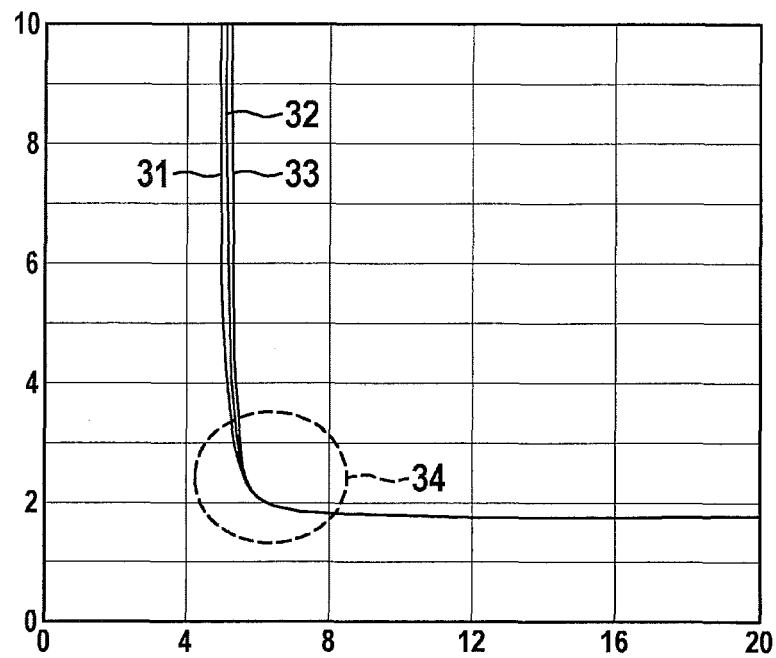
FIG. 3 shows characteristic curves of an active switching element in an active bridge rectifier which is controllable according to one specific embodiment of the present invention.

FIG. 3 illustrates characteristic curves 31, 32, and 33 of an active switching element for a bridge rectifier which is controllable according to one specific embodiment of the present invention. For example, these are characteristic curves 31, 32, and 33 of a switching element S of the bridge rectifier 1 illustrated in FIG. 1, for example, a corresponding MOSFET.

A voltage between the gate and the source of the active switching element, for example, a voltage value of a control signal of a control device 3 used for controlling an active switching element S, is indicated on the x axis. The y axis indicates the resulting forward resistance in mΩ. Characteristic curves 31, 32, and 33 relate to a current flow of 21 A, 52 A, and 82 A, respectively.

As is apparent, a voltage of approximately 5 V to 6 V between the gate and the source of the switching element results in a drastic dip in the forward resistance to approximately 3 mΩ (so-called threshold voltage). However, initially the minimum value of approximately 1.8 mΩ is not yet reached here. Therefore, in area 34 illustrated in dashed lines, which encompasses approximately 2 V, the forward resistance may be influenced by adapting the voltage which is present between the gate and the source. If this area of 8 V to 4 V, for example, is slowly passed through during load shedding, the steep current rises illustrated in FIG. 2 may be damped. Line inductances which are present are thus given enough time to develop an appropriate buffering effect. Thus, harmful overvoltages or undervoltages are no longer generated.

Figure 4:
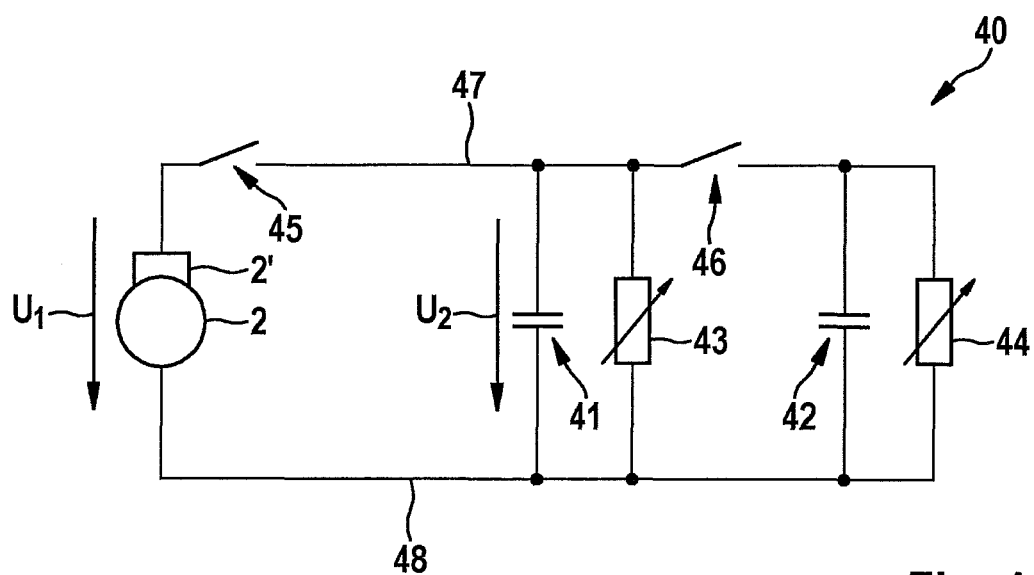
FIG. 4 shows a system for testing load shedding, which may be operated according to the present invention, in a schematic illustration.

FIG. 4 shows a schematic illustration of a system 40 for testing or simulating load shedding, which may be used according to the present invention. System 40 includes a generator 2, as explained above with reference to FIG. 1. A voltage U1 is present at the generator.

Capacitors 41 and 42 and load resistors 43 and 44 of system 40 represent capacitors and resistors, respectively, of an actual vehicle electrical system. A voltage U2 drops at the actual vehicle electrical system. These capacitors and resistors are connected to generator 2 via a line 47, and are switchable via switches 45 and 46. Line 47 simulates the inductance of the vehicle electrical system, resulting in a voltage difference between U1 and U2 in the event of load shedding.

At the start of a load shedding test, the two switches 45 and 46 are closed. Generator 2 delivers a current to the vehicle electrical system which is computed from voltage U2 and load resistors 43 and 44.

Load shedding may be simulated by opening one of switches 45 or 46. Opening of switch 45 corresponds to a load drop to 0%, as would be caused in reality, for example, by the battery bolt to the generator falling off. In contrast, opening of switch 46 simulates a partial load drop, as is caused by disconnecting a fairly large resistive load in the vehicle electrical system. The magnitude of the "shed" load current may be set via the resistance value of load resistor 44, and the magnitude of the remaining current of the vehicle electrical system may be set via the resistance value of load resistor 43.

It is important to note that, due to the pulse-shaped delivery of current of the generator (see FIG. 2), an energy store, for example in the form of a capacitor, is necessary for continuously supplying voltage to the direct voltage network. This is always the case, for example, in customary direct voltage networks such as vehicle electrical systems. However, the interruption of the described phase short circuits results in a voltage rise due to the line inductances.

Figure 5:
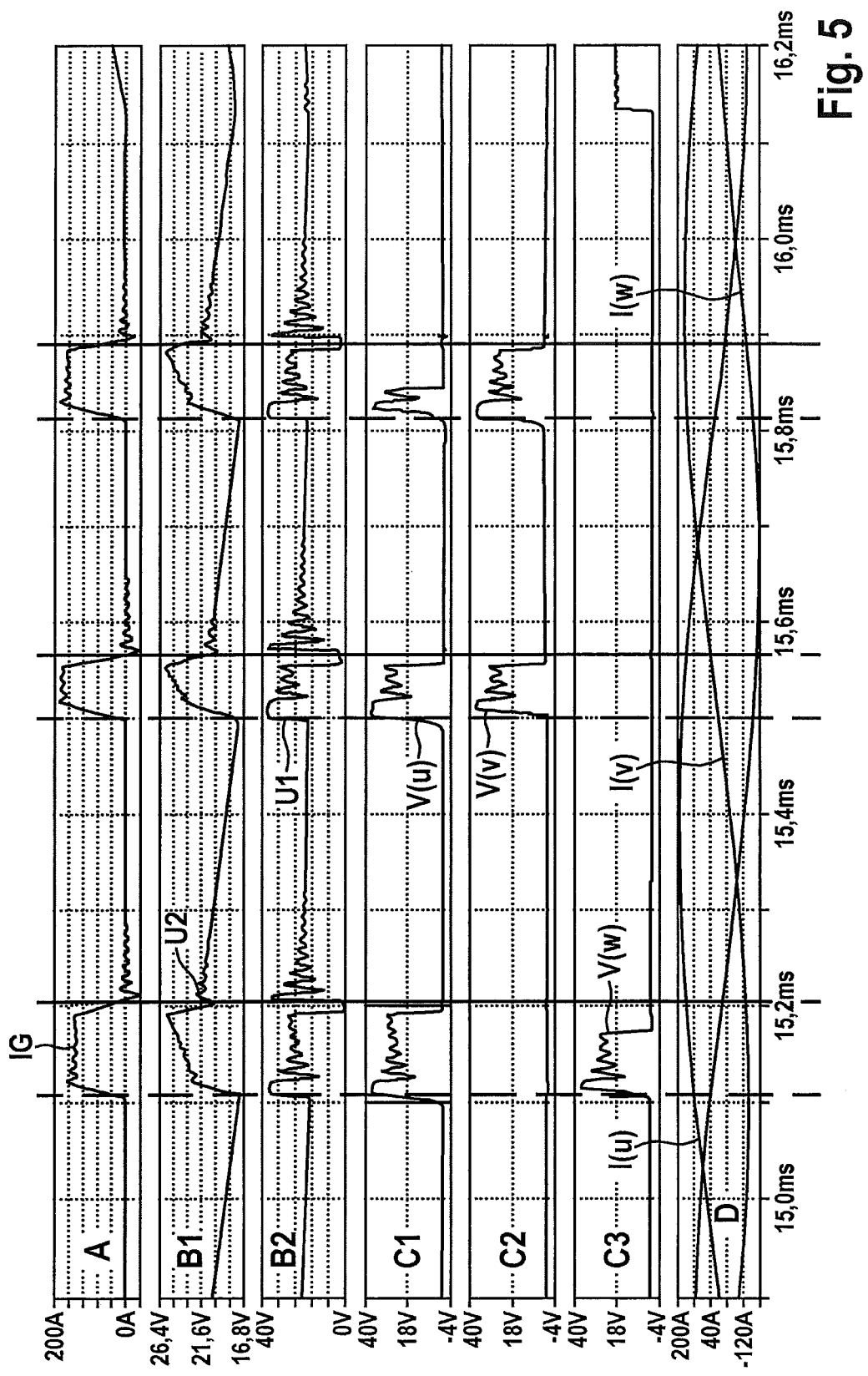
FIG. 5 shows current and voltage patterns in an active bridge rectifier which is controlled according to the related art.
Figure 6:
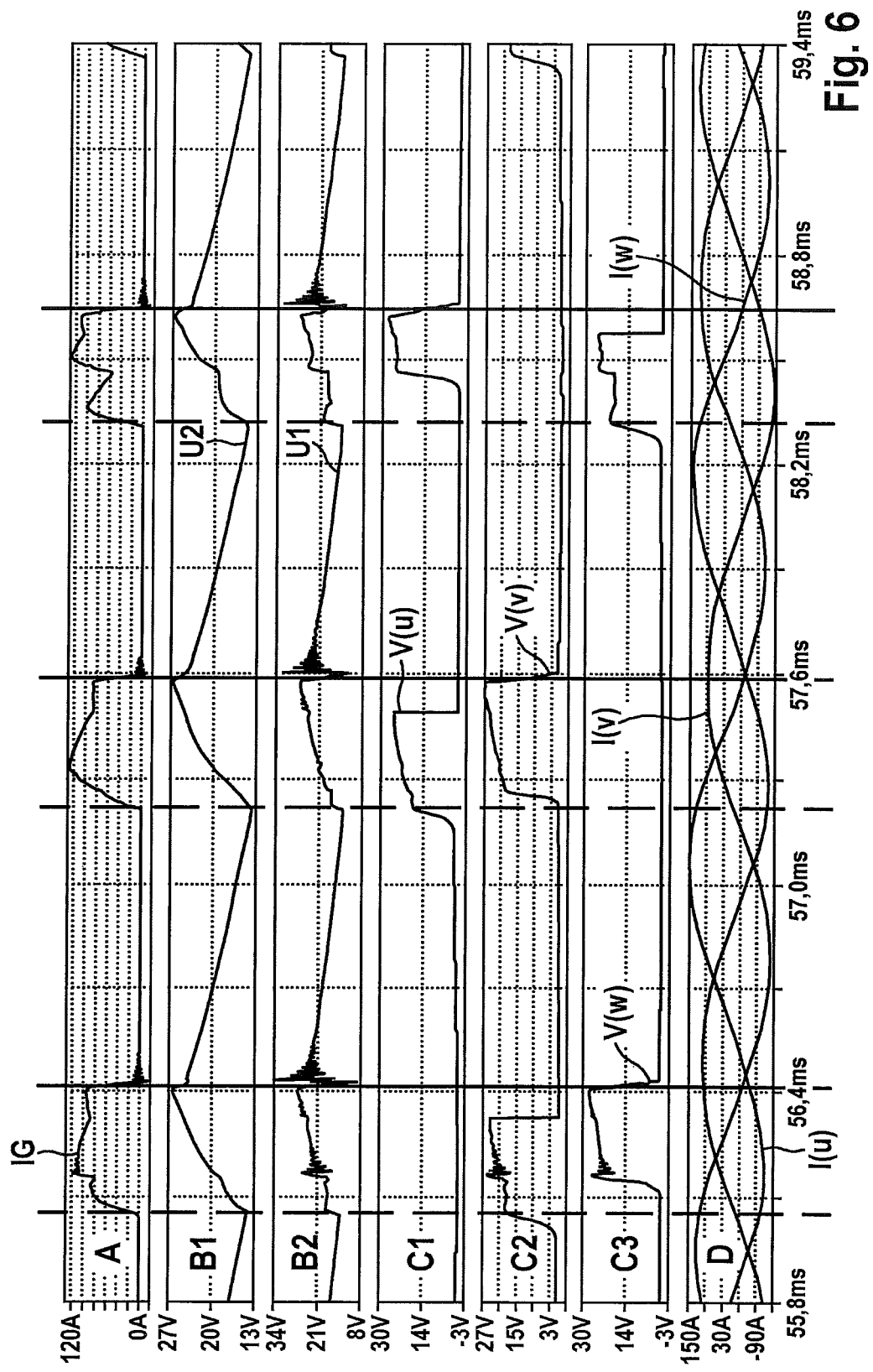
FIG. 6 shows current and voltage patterns in an active bridge rectifier which is controlled according to one specific embodiment of the present invention.

FIGS. 5 and 6 show current and voltage patterns in an active bridge rectifier which is controlled according to the related art (FIG. 5) and according to one specific embodiment of the present invention (FIG. 6). This involves a three-phase generator which includes a corresponding rectifier, as illustrated, for example, in the system in FIG. 1. The current and voltage patterns are indicated in A and V, respectively, on the y axes of subdiagrams A through D in each case, as a function of time in ms indicated on the shared x axis. FIGS. 5 and 6 are illustrated with reference to currents and voltages which occur in a system illustrated in FIG. 4. However, corresponding currents and voltages similarly occur in actual load shedding situations.

Points in time after which an activation of a short circuit in the particular switching elements is initiated are denoted in each case by vertical solid lines, while dashed lines correspondingly indicate the points in time after which the process of deactivating the short circuit is thus begun.

Subdiagrams A show a delivered generator current denoted by reference character IG. In system 40 in FIG. 4, for example, the delivered generator current may be measured in line 47. Subdiagrams B1 and B2 illustrate voltage patterns which correspond to voltages U2 and U1, respectively, in FIG. 4. Subdiagrams C1 through C3 show phase voltages V(u) through V(w), respectively, at generator phases u through w of the three-phase generator used. Subdiagrams D show the phase currents in each case.

As is apparent in particular from a review of subdiagrams B1 and B2 in FIGS. 5 and 6, within the scope of the conventional control (FIG. 5), in particular the fluctuations in voltage U1 reach values which may have a harmful effect on installed electronics systems. This is avoided in the control according to the specific embodiment of the present invention (FIG. 6).

Figure 7:
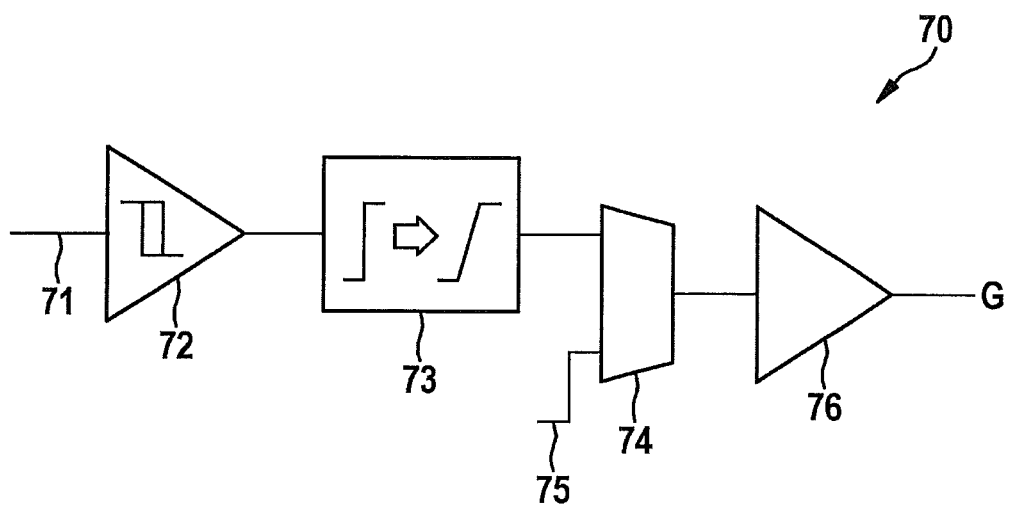
FIG. 7 shows a circuit for controlling an active switching element according to one specific embodiment of the present invention.

FIG. 7, which is denoted overall by reference numeral 70, shows the circuitry-wise implementation of a retarded control during load shedding according to one specific embodiment of the present invention.

A corresponding voltage is continuously monitored with the aid of a comparator 72 for load shedding recognition, via a terminal 71 which is connected, for example, to a positive voltage terminal B+ at a generator output (see FIG. 1). If load shedding is recognized at terminal 71, an output signal is output via comparator 72.

On the basis of the output signal of comparator 72, a ramp controller 73 limits the steepness of a signal edge for controlling switching elements, for example switching elements S in FIG. 1, as explained several times above.

For the duration of the phase short circuit, a prioritization device 74 switches off the regular control signal which is present at an input 75. This results in a correspondingly retarded voltage change through a gate driver 76 at gate G of switching element S.

What is claimed is:

1. A method for controlling a bridge rectifier having active switching elements, the method comprising:

controlling, during normal operation, at least one of the active switching elements using a voltage signal, the voltage of which is changed, within at least one switching time, from a first voltage value at the start of the switching time to a second voltage value at the end of the switching time, wherein the lower of the first and second voltage values is below a threshold voltage of the switching element and the higher of the first and second voltage values is above the threshold voltage of the switching element; and extending, when load shedding at the bridge rectifier is determined, the at least one switching time by a predefinable time period to decrease a slope of the voltage signal used to switch the at least one of the active switching elements.

2. The method of claim 1, wherein in the at least one active switching element different resistance values are generatable between switching terminals which are switchable by the active switching element, the different resistance values generated by controlling the at least one of the active switching elements with different voltage values of the voltage signal between the first and the second voltage value.

3. The method of claim 2, wherein controlling the at least one active switching element by continuously adjusting the voltage values between the first and the second voltage value results in a continuous change in the resistance between the switching terminals.

4. The method of claim 2, wherein the at least one active switching element includes at least one transistor, and wherein a gate of the at least one transistor is acted on by the voltage signal.

5. The method of claim 4, wherein the first voltage value is a voltage value which is below a threshold voltage of the at least one transistor, and wherein the second voltage value is a voltage value which is above the threshold voltage of the at least one transistor.

6. The method of claim 1, wherein load shedding is determined based on an output signal which is output by the bridge rectifier during normal operation.

7. The method of claim 1, wherein when load shedding is determined, a voltage signal which is present at a half bridge is diverted, at least temporarily, to a ground terminal via the at least one active switching element.

8. The method of claim 1, wherein the time period by which the switching time is extended is determined based on a maximum allowed voltage rise and at least one inductance value in a network which the active bridge rectifier feeds.

9. A rectifier system, comprising:
a bridge rectifier having active switching elements;
a control device to control at least one of the active switching elements using a voltage signal, the voltage of which is changed, within at least one switching time, from a first voltage value at the start of the switching time to a second voltage value at the end of the switching time, wherein the lower of the first and second voltage values is below a threshold voltage of the switching element and the higher of the first and second voltage values is above the threshold voltage of the switching element;
a determining arrangement to determine load shedding at the bridge rectifier; and
an extending arrangement to extend, when loading shedding at the bridge rectifier is determined, the at least one switching time by a predefinable time period to decrease a slope of the voltage signal used to switch the at least one of the active switching elements.

10. A non-transitory machine-readable storage medium having program instructions, which when executed by a processor perform a method for controlling a bridge rectifier having active switching elements, the method comprising:
controlling, during normal operation, at least one of the active switching elements using a voltage signal, the voltage of which is changed, within at least one switching time, from a first voltage value at the start of the switching time to a second voltage value at the end of the switching time, wherein the lower of the first and second voltage values is below a threshold voltage of the switching element and the higher of the first and second voltage values is above the threshold voltage of the switching element; and
extending, when load shedding at the bridge rectifier is determined, the at least one switching time by a predefinable time period to decrease a slope of the voltage signal used to switch the at least one of the active switching elements.

11. The rectifier system of claim 9, wherein the determining arrangement includes a comparator to compare a voltage at an output terminal of a generator including the bridge rectifier to a threshold voltage.

12. The rectifier system of claim 9, wherein the extending arrangement includes a ramp controller to control to the slope of the voltage signal.

13. The method of claim 1, wherein the at least one switching time is extended, and the slope of the voltage signal is decreased, relative to the at least one switching time and the slope of the voltage signal during normal operation.

14. The method of claim 1, wherein the at least one active switching element is switched using the extended at least one switching time during a deactivation of a short circuit produced during load shedding by the at least one active switching element.

15. The method of claim 1, wherein the at least one active switching element is switched using the extended at least one switching time during an activation of a short circuit produced during load shedding by the at least one active switching element.

16. The method of claim 1, wherein only a single one of the at least one active switching elements is switched at any given time during load shedding.

* * * * *